(12) United States Patent
Li

(10) Patent No.: US 11,088,265 B2
(45) Date of Patent: Aug. 10, 2021

(54) SEMICONDUCTOR STRUCTURE HAVING A REPAIRED DIELECTRIC LAYER

(71) Applicants: Semiconductor Manufacturing International (Shanghai) Corporation, Shanghai (CN); SMIC New Technology Research and Development (Shanghai) Corporation, Shanghai (CN)

(72) Inventor: Yong Li, Shanghai (CN)

(73) Assignees: Semiconductor Manufacturing International (Shanghai) Corporation, Shanghai (CN); SMIC New Technology Research and Development (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/702,688

(22) Filed: Dec. 4, 2019

(65) Prior Publication Data

US 2020/0105611 A1   Apr. 2, 2020

Related U.S. Application Data

(62) Division of application No. 16/046,799, filed on Jul. 26, 2018, now Pat. No. 10,529,626.

(30) Foreign Application Priority Data

Jul. 27, 2017  (CN) .......................... 201710622855.1

(51) Int. Cl.
*H01L 29/76*  (2006.01)
*H01L 29/66*  (2006.01)
(Continued)

(52) U.S. Cl.
CPC ...... *H01L 29/66795* (2013.01); *H01L 21/283* (2013.01); *H01L 21/28008* (2013.01);
(Continued)

(58) Field of Classification Search
CPC ............. H01L 29/66795; H01L 29/785; H01L 29/66545; H01L 29/41791; H01L 29/7848;
(Continued)

(56) References Cited

U.S. PATENT DOCUMENTS 9,515,182 B2 *  12/2016  Kim ................... H01L 29/0653
2016/0111322 A1 *  4/2016  Liu ................... H01L 29/66795
438/157

(Continued)

*Primary Examiner* — Shouxiang Hu
(74) *Attorney, Agent, or Firm* — Anova Law Group, PLLC

(57) ABSTRACT

A semiconductor structure is provided. The semiconductor structure includes a base substrate; and a first doped epitaxial layer and a second doped epitaxial layer in the base substrate. Each of the first and second doped epitaxial layers is corresponding to a different gate structure on the base substrate. The semiconductor structure further includes a repaired dielectric layer formed on and surrounding each of the first and second doped epitaxial layer; a metal layer on the repaired dielectric layer; an interlayer dielectric layer over the base substrate and covering tops of gate structures; and a conductive plug on the metal layer and through the interlayer dielectric layer.

11 Claims, 5 Drawing Sheets

(51) Int. Cl.

| | | |
|---|---|---|
| *H01L 21/8234* | (2006.01) | |
| *H01L 23/522* | (2006.01) | |
| *H01L 21/768* | (2006.01) | |
| *H01L 27/088* | (2006.01) | |
| *H01L 21/8238* | (2006.01) | |
| *H01L 23/485* | (2006.01) | |
| *H01L 21/285* | (2006.01) | |
| *H01L 29/78* | (2006.01) | |
| *H01L 27/092* | (2006.01) | |
| *H01L 21/28* | (2006.01) | |
| *H01L 21/283* | (2006.01) | |
| *H01L 21/84* | (2006.01) | |
| *H01L 29/06* | (2006.01) | |
| *H01L 29/417* | (2006.01) | |

(52) U.S. Cl.
CPC .. *H01L 21/28512* (2013.01); *H01L 21/76814* (2013.01); *H01L 21/76877* (2013.01); *H01L 21/823431* (2013.01); *H01L 21/823475* (2013.01); *H01L 21/823814* (2013.01); *H01L 21/823821* (2013.01); *H01L 21/823857* (2013.01); *H01L 21/845* (2013.01); *H01L 23/485* (2013.01); *H01L 23/5226* (2013.01); *H01L 27/0886* (2013.01); *H01L 27/0924* (2013.01); *H01L 29/0653* (2013.01); *H01L 29/41783* (2013.01); *H01L 29/66454* (2013.01); *H01L 29/66545* (2013.01); *H01L 29/785* (2013.01); *H01L 29/7848* (2013.01); *H01L 21/76825* (2013.01); *H01L 21/76828* (2013.01); *H01L 21/76831* (2013.01); *H01L 29/41791* (2013.01)

(58) Field of Classification Search
CPC ........... H01L 29/0653; H01L 29/41783; H01L 29/42364; H01L 29/66636; H01L 21/823475; H01L 21/28008; H01L 21/283; H01L 21/828814; H01L 21/845; H01L 21/823857; H01L 21/823821; H01L 23/485; H01L 21/28512; H01L 27/0924; H01L 23/5226; H01L 21/823431; H01L 21/76877; H01L 27/0886; H01L 21/76814; H01L 21/76828; H01L 21/76825; H01L 21/76831; H01L 21/823871
See application file for complete search history.

(56) References Cited

U.S. PATENT DOCUMENTS

| | | | |
|---|---|---|---|
| 2016/0211251 A1* | 7/2016 | Liaw | .................. H01L 27/0207 |
| 2016/0233088 A1 | 8/2016 | Feng et al. | |
| 2018/0061949 A1 | 3/2018 | Aderhold et al. | |
| 2018/0175029 A1* | 6/2018 | Ching | .................. H01L 21/32 |
| 2018/0197786 A1* | 7/2018 | Li | ........................ H01L 27/0886 |
| 2018/0212029 A1 | 7/2018 | Xu et al. | |
| 2018/0358476 A1 | 12/2018 | Balakrishnan et al. | |

\* cited by examiner

SEMICONDUCTOR STRUCTURE HAVING A REPAIRED DIELECTRIC LAYER

CROSS-REFERENCES TO RELATED APPLICATION

This application is a divisional of U.S. patent application Ser. No. 16/046,799, filed on Jul. 26, 2018, which claims the priority of Chinese Patent Application No. 201710622855.1, filed on Jul. 27, 2017, the content of which is incorporated herein by reference in its entirety.

TECHNICAL FIELD

The present disclosure generally relates to the field of semiconductor technologies and, more particularly, relates to a semiconductor structure and its fabrication method.

BACKGROUND

In processes for fabricating integrated circuits, different semiconductor devices need to be connected to form circuits after forming semiconductor device structures. As the integration circuits develop, requirements on integration levels and on performances of the integrated circuits become higher and higher. To improve the integration levels and reduce costs, critical dimensions of the semiconductor devices continuously decrease and circuit densities in the integration circuits continuously increase. Correspondingly, a wafer may not provide enough area to form interconnecting wires for conventional circuits.

To meet the requirements for interconnecting wires due to the reduced critical dimensions, interconnecting structures are used to connect between different metal layers and to connect metal layers with the semiconductor structures. The interconnecting structures usually include interconnecting wires and conductive plugs in contact holes. The conductive plug in the contact hole may be used to connect to a semiconductor device. The interconnecting wires may be used to connect conductive plugs in different semiconductor devices, to form circuits.

As process nodes of the integrated circuits and the critical dimensions of the devices continuously decrease, contact areas of the conductive plugs in the contact holes continuously decrease, and a contact resistance between the conductive plugs and the semiconductor devices increase. The formed semiconductor structures have poor performances.

SUMMARY

One aspect of the present disclosure provides a fabrication method of a semiconductor structure. The method includes: providing a base substrate; forming a first doped epitaxial layer and a second doped epitaxial layer in the base substrate, each of the first and second doped epitaxial layers corresponding to a different gate structure on the base substrate; forming an interlayer dielectric layer over the base substrate and above the first and second doped epitaxial layers; forming a contact opening in the interlayer dielectric layer to expose the first and second doped epitaxial layers and a portion of the base substrate; forming a dielectric layer on and surrounding each of the first and second doped epitaxial layer; applying a repairing process on the dielectric layer; after the repairing process, forming a metal layer on the dielectric layer; and after forming the metal layer in the contact opening, forming a conductive plug in the contact opening.

Another aspect of the present disclosure provides a semiconductor structure. The semiconductor structure includes: a base substrate; a first doped epitaxial layer and a second doped epitaxial layer in the base substrate, each of the first and second doped epitaxial layers corresponding to a different gate structure on the base substrate; a repaired dielectric layer formed on and surrounding each of the first and second doped epitaxial layer; a metal layer on the repaired dielectric layer; an interlayer dielectric layer over the base substrate and covering tops of gate structures; and a conductive plug on the metal layer and through the interlayer dielectric layer.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

To reduce the contact resistances between the conductive plugs in the contact openings and the semiconductor devices, metal silicide layers are formed to form low-ohm contacts between the conductive plugs in the contact openings and doped epitaxial layers.

The metal silicide layers are formed by reacting metal layers with doped epitaxial layers. As process nodes of the integrated circuits and the critical dimensions of the devices continuously decrease, spaces for forming the doped epitaxial layers and volumes of the doped epitaxial layers continuously decrease. Forming the metal silicide layers becomes more difficult, and the metal silicide layers have poor quality. The contact resistances between the conductive plugs in the contact openings and doped epitaxial layers become larger. Conventional metal silicide layer technologies already approach a limit for reducing the contact resistances.

Metal-insulator-semiconductor (MIS) structures are used to break through the limit to reduce the contact resistances in the metal silicon layer technologies. A doped epitaxial layer, a dielectric layer formed on the doped epitaxial layer, and a metal layer formed on the dielectric layer form an MIS structure. Positions of Fermi levels in interfaces between the conductive plugs in the contact openings and the doped epitaxial layers are changed. Schottky barrier heights and then the contact resistances are reduced.

However, after forming the dielectric layer on the doped epitaxial layer, the dielectric layer usually have poor quality, and an interface between the dielectric layer and the doped epitaxial layer have a large number of interface defects. Correspondingly, Fermi level pinning effects cannot be alleviated effectively. The Schottky barrier heights and then the contact resistances cannot be reduced effectively.

The present disclosure provides a semiconductor structure and its fabrication method. In the method, after forming a dielectric layer, a repairing process may be applied on the dielectric layer to repair dangling bonds in the dielectric layer and to densify the dielectric layer. The interface defects in the interface between the dielectric layer and the doped epitaxial layer may be reduced. Correspondingly, the contact resistances may be reduced and the performance of the semiconductor structure may be improved.

Figure 6:
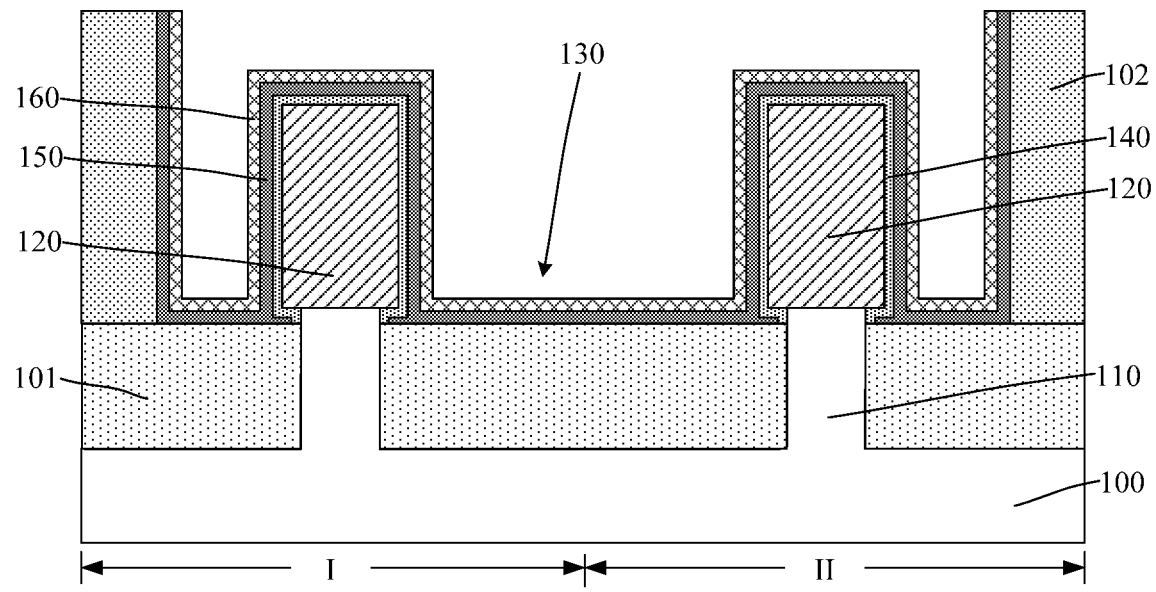
Figure 7:
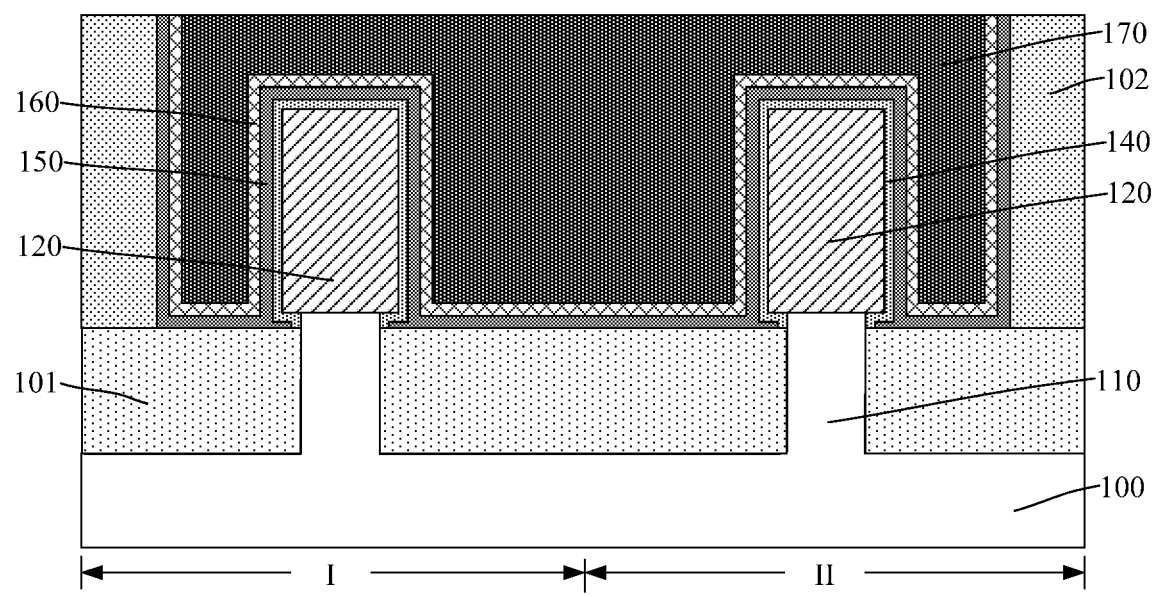
Figure 8:
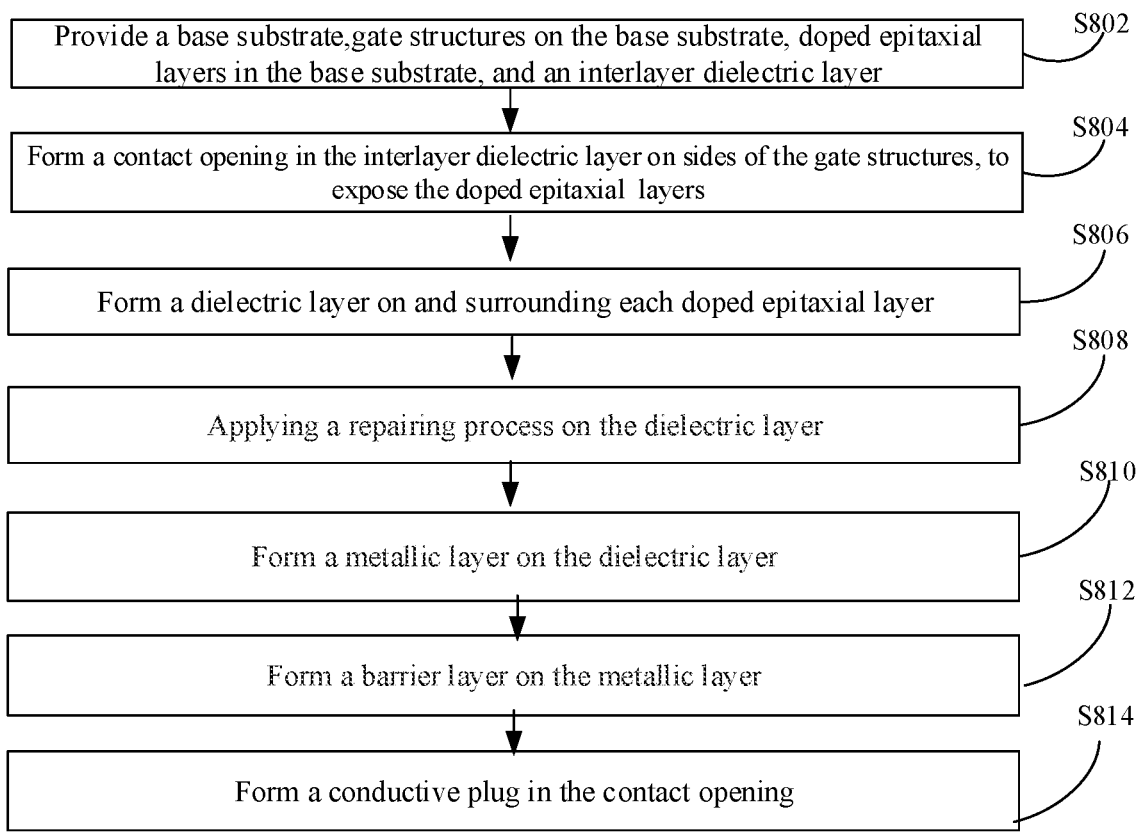
FIG. 8 illustrates an exemplary method for forming a semiconductor structure according to various disclosed embodiments of the present disclosure.

FIGS. 1-7 illustrate semiconductor structures corresponding to certain stages for forming an exemplary semiconductor structure according to various disclosed embodiments of the present disclosure; and FIG. 8 illustrates an exemplary method for forming a semiconductor structure according to various disclosed embodiments of the present disclosure.

Figure 1:
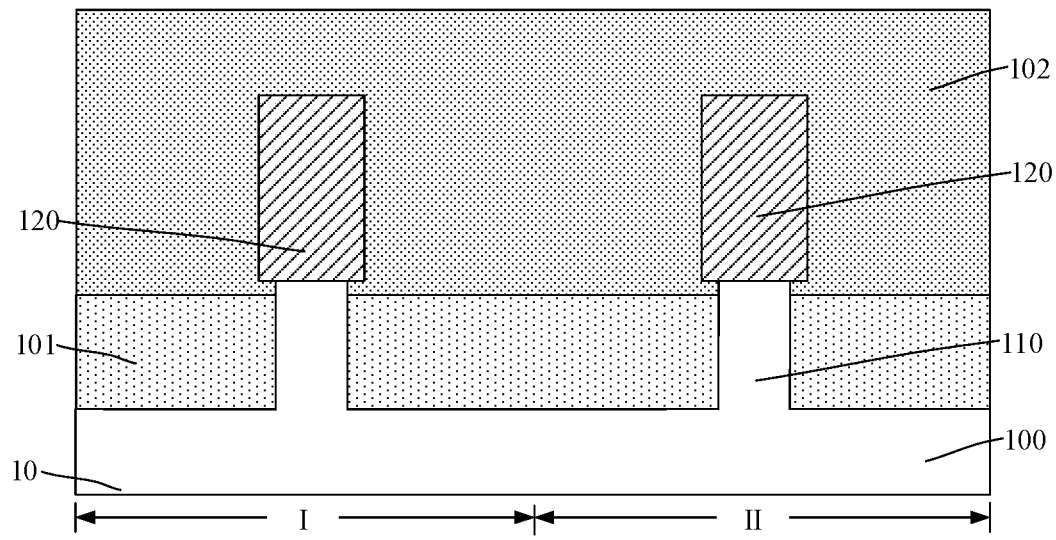
FIGS. 1-7 illustrate semiconductor structures corresponding to certain stages for forming an exemplary semiconductor structure according to various disclosed embodiments of the present disclosure.

Referring to FIG. 1 which is a cross-section view perpendicular to an extending direction of fins and at doped epitaxial layers, a base substrate 10 may be provided and gate structures (not shown in the figures) may be formed on the base substrate 10 (e.g., in Step S802 in FIG. 8). The doped epitaxial layers 120 may be formed in the base substrate 10 on sides of a gate structure. An interlayer dielectric layer 102 may be formed on the base substrate 10 to cover the gate structures.

In one embodiment, the doped epitaxial layers may include a first doped epitaxial layer and a second doped epitaxial layer in the base substrate. Each of the first and second doped epitaxial layers corresponds to a different gate structure on the base substrate.

In one embodiment, the formed semiconductor structure may have fin structures, and may be a fin field effect transistor (FinFET). The base substrate 10 may include a substrate 100, and a plurality of discrete fins 110. In other embodiments, the formed semiconductor structure may have a planar structure and the base substrate may be a planar substrate.

The substrate 100 may provide a platform for forming the semiconductor structure and the fins 110 may provide channels for the formed FinFET subsequently.

In one embodiment, the substrate 100 may be made of silicon. In another embodiment, the substrate 100 may be made of a material including germanium, SiGe, SiC, GaAs, and/or InGa. In another embodiment, the substrate 100 may be a silicon substrate on an insulator, a germanium substrate on an insulator, or another substrate. The material of the substrate 1000 may be appropriate for the process and/or may be easy for integration.

The fins 110 may be made of a material same as the substrate 100, including silicon, germanium, SiGe, SiC, GaAs, and/or InGa, although any suitable materials may be used for the fins according to various embodiments of the present disclosure.

In some embodiment, a first doped epitaxial layer may be formed in a first fin and on a side of a first gate structure formed on the first fin. A second doped epitaxial layer may be formed in a second fin and on a side of a second gate structure formed on the second fin.

In one embodiment, the formed semiconductor structure may have a CMOS structure, and the substrate 100 may include a PMOS region I to form a PMOS transistor and an NMOS region II to form an NMOS transistor. In other embodiments, the formed semiconductor structure may have a PMOS structure or an NMOS structure. Correspondingly, the base substrate may include a PMOS region or an NMOS region.

In one embodiment, the PMOS region I and the NMOS region II may be adjacent to each other. In other embodiments, the PMOS region I and the NMOS region II may be alternatingly formed with one another.

The substrate 100 and the fins 110 may be formed by: providing an initial substrate; forming a patterned fin mask layer on a top surface of the initial substrate; and etching the initial substrate using the pattern fin mask layer as a mask. After etching, a remaining portion of the initial substrate may be used as the substrate 100, and protrusions on the substrate 100 may be used as the fins 110.

In one embodiment, after forming the substrate 100 and the fins 110, the fin mask layer may remain at least on top of the fins. The fin mask layer may be made of $SiN_x$. In a subsequent planarizing process, the fin mask layer may protect tops of the fins 110 and a top surface of the fin mask layer may determine a stop position of the planarizing process.

After forming the substrate 100 and the fins 110, an isolation structure 101 may be formed on the substrate 100. The isolation structure 101 may cover a portion of sidewalls of the fins 110 and may have a top lower than the tops of the fins 110.

The isolation structure 101 may electrically isolate adjacent devices from each other and isolate adjacent fins 110 from each other. In various embodiments, the isolation structure 101 may be made of an insulating material including $SiO_2$, $SiN_x$, and/or $SiN_xO_y$.

The isolation structure 101 may be formed by: forming an isolation film on the substrate 100 with a top higher than a top of the fin mask layer (not shown in the figures); removing a portion of the isolation film higher than the top of the fin mask layer by polishing; etching back a partial thickness of the remaining isolation film to form the isolation structure 101; and removing the fin mask layer.

The gate structures may control conduction and/or truncation of channels in the formed semiconductor structure. The doped epitaxial layers 120 may be used as sources and/or drains of the channels in the formed semiconductor structure.

In one embodiment, the gate structures may be metal gate structures. Each gate structure may include a gate dielectric layer and a metal gate electrode. In other embodiments, the gate structures may be other structures including polysilicon gate structures.

In one embodiment, the doped epitaxial layers 120 may be formed in the fins 110 on the sides of the gate structures. The substrate 100 may include the PMOS region I and the NMOS region II. Correspondingly, P-type doped epitaxial layers 120 may be formed in the fins 110 on the sides of a gate structure in the PMOS region I, and N-type doped epitaxial layers 120 may be formed in the fins 110 on the sides of a gate structure in the NMOS region II.

In one embodiment, the gate structures may be formed by a gate last high-k metal gate technology (HKMG). A process for forming the gate structures and the doped epitaxial layers 120 may include: after forming the base substrate 10, forming dummy gate structures (not shown in the figures) across the fins 110 to cover a portion of the tops of the fins 110 and a portion of the sidewalls of the fins 110; forming the P-type doped epitaxial layers 120 in the fins 110 on the sides of a dummy gate structure in the PMOS region I; forming the N-type doped epitaxial layers 120 in the fins 110 on the sides of a dummy gate structure in the NMOS region II; after forming the doped epitaxial layer 120, forming the interlayer dielectric layer 102 on the substrate 100 to expose tops of the dummy gate structures; removing the dummy gate structures to form gate openings (not shown in the figures) in the interlayer dielectric layer 102; and forming a metal gate structure in each gate opening.

The dummy gate structures may occupy spaces for subsequently forming the gate structures.

In one embodiment, each dummy gate structure may have a multilayer structure and may include a dummy oxide layer (not shown in the figures) and a dummy gate electrode (not shown in the figures) on the dummy oxide layer. In other embodiments, each dummy gate structure may have a single-layer structure and may include a dummy gate electrode.

In one embodiment, the dummy oxide layer may be made of $SiO_2$. In another embodiment, the dummy oxide layer may be made of a material including $SiN_xO_y$.

In one embodiment, the dummy gate electrode may be made of polysilicon. In another embodiment, the dummy gate electrode may be made of a material including $SiN_x$, $SiN_xO_y$, SiC, SiCO, SiCNO, and/or amorphous carbon.

The dummy gate structures may be formed by: forming an oxide material layer on the tops of the fins 110 exposed by the isolation structure 101; forming a dummy gate material layer on the oxide material layer; forming a gate mask layer (not shown in the figures) on a top surface of the dummy gate material layer; etching the dummy gate material layer using the gate mask layer as a mask, to expose the oxide material layer and to form the dummy gate electrodes on the oxide material layer; removing a portion of the oxide material layer exposed by the dummy gate electrodes to expose the top surfaces of the fins 110. The remaining oxide material layer covered by the dummy gate electrodes may be used as the dummy oxide layers. The dummy gate electrodes may cross the fins 110, and may be located on a portion of the top surfaces of the fins 110 and on a portion of the sidewalls of the fins 110. The dummy oxide layers may cross the fins 110, and may be located on a portion of the top surfaces of the fins 110 and on a portion of the sidewalls of the fins 110.

In one embodiment, the gate mask layer may be made of $SiN_x$ and a portion of the gate mask layer on top of the dummy gate structures may be maintained after forming the dummy gate structures. The gate mask layer may protect the tops of the dummy gate structures in subsequent processes. In other embodiments, the gate mask layer may be made of a material including $SiN_xO_y$, SiC, and/or BN.

The doped epitaxial layers 120 in the PMOS region I may be used to form sources and/or drains of the PMOS device.

The P-type doped epitaxial layers 120 in the PMOS region I may be formed by: forming first epitaxial layers in the fins 110 on sides of a dummy gate structure in the PMOS region I by a selective epitaxial growth process; and doping the first epitaxial layers with P-type ions to form the P-type doped epitaxial layers 120.

In one embodiment, when forming the first epitaxial layers, the first epitaxial layers may be in-situ self-doped with P-type ions to form the P-type doped epitaxial layers 120.

In various embodiments, the first epitaxial layers may be made of a material including silicon and/or SiGe. The P-type ions may be boron, indium, gallium, or a combination thereof. A concentration of the P-type ions may be determined by the actual process requirement.

In one embodiment, the first epitaxial layers may be made of SiGe, and the P-type ions may be boron ions. Correspondingly, the P-type doped epitaxial layers in the PMOS region I may be made of SiGeB.

The first epitaxial layers may exert stress on the channels in the PMOS device, to enhance mobilities of the carriers in the PMOS device.

The doped epitaxial layers 120 in the NMOS region II may be used to form sources and/or drains of the NMOS device.

The N-type doped epitaxial layers 120 in the NMOS region II may be formed by: forming second epitaxial layers in the fins 110 on the sides of the dummy gate structure in the NMOS region II by a selective epitaxial growth process; and doping the second epitaxial layers with N-type ions to form the N-type doped epitaxial layers 120.

In one embodiment, when forming the second epitaxial layers, the second epitaxial layers may be in-situ self-doped with N-type ions to form the N-type doped epitaxial layers 120.

In various embodiments, the second epitaxial layers may be made of a material including silicon and/or SiC. The N-type ions may be phosphor ions, arsenic ions, antimony ions, or a combination thereof. A concentration of the N-type ions may be determined by the actual process requirement.

In one embodiment, the second epitaxial layers may be made of Si, and the N-type ions may be phosphor ions. Correspondingly, the N-type doped epitaxial layers in the NMOS region I may be made of SiP. The N-type doped epitaxial layers made of SiP may reduce the contact resistances in the NMOS region II.

The interlayer dielectric layer 102 may electrically isolate the adjacent semiconductor structures from each other. In one embodiment, the interlayer dielectric layer 102 may be made of $SiO_2$. In another embodiment, the interlayer dielectric layer 102 may be made of a dielectric material including $SiN_x$, and/or $SiN_xO_y$.

The interlayer dielectric layer 102 may be formed by: forming an interlayer dielectric film on the substrate 100 and covering tops of the dummy gate structures; and removing a portion of the interlayer dielectric film higher than the tops of the dummy gate structures by polishing. The remaining interlayer dielectric film may be used as the interlayer dielectric layer 102.

The gate mask layer may be formed on the tops of the dummy gate structures. Correspondingly, when removing the portion of the interlayer dielectric film higher than the tops of the dummy gate structures by polishing, the gate mask layer may also be removed and a top of the interlayer dielectric layer 102 may be coplanar with the tops of the dummy gate structures.

The gate structures may be formed by: forming a gate dielectric layer on the substrate 100 exposed by each gate opening; and forming a metal gate electrode on each gate dielectric layer.

The gate dielectric layer may be made of a high-k dielectric material with a dielectric constant higher than a dielectric constant of $SiO_2$. In one embodiment, the gate dielectric layer may be made of $HfO_2$. In another embodiment, the gate dielectric layer may be made of $ZrO_2$, HfSiO, HfSiON, HfTaO, HfZrO, and/or $Al_2O_3$.

In one embodiment, the bottom of the gate opening may expose a portion of the top of the corresponding fin 110 and a portion of the sidewalls of the corresponding fin 110. Correspondingly, the gate dielectric layer may cross the corresponding fin 110, and cover a portion of the top of the corresponding fin 110 and a portion of the sidewalls of the corresponding fin 110.

In one embodiment, the metal gate electrode may be made of W. In another embodiment, the metal gate electrode may be made of a material including Al, Cu, Ag, Au, Pt, Ni, and/or Ti.

In above description, the present disclosure was described by using an embodiment with the gate last high-k metal gate process. In other embodiments, the gate structures may be formed by a gate first high-k metal gate process. Correspondingly, the doped epitaxial layers and the interlayer dielectric layers may be formed after forming the gate structures.

Figure 2:
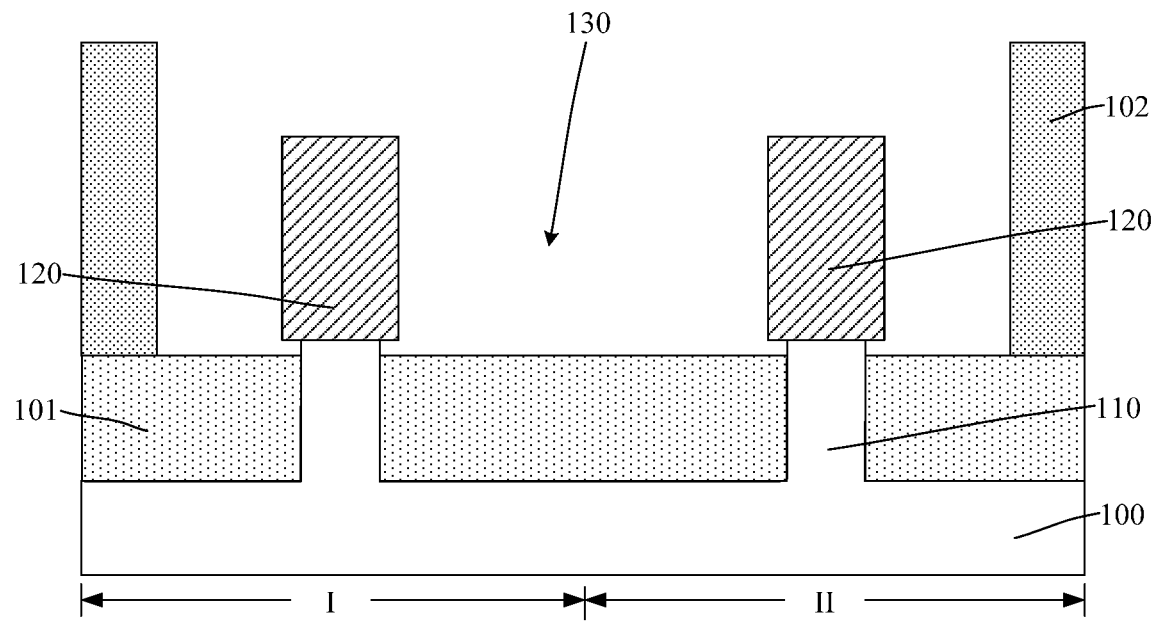

Referring to FIG. 2, a contact opening 130 may be formed in the interlayer dielectric layer 102 on the sides of the gate structures (not shown in the figures), to expose the doped epitaxial layers 120 (e.g., in Step S804 in FIG. 8).

The contact opening 130 may expose the doped epitaxial layers 120 and may provide a platform for forming a conductive plug connected to the doped epitaxial layers 120.

In one embodiment, the PMOS region I and the NMOS region II may be adjacent to each other. The contact opening 130 may cross the PMOS region I and the NMOS region II, to increase a process window and to reduce a processing difficulty for forming the conductive plug in the contact opening.

Correspondingly, the contact opening 130 may expose the doped epitaxial layers 120 in the PMOS region I and the doped epitaxial layers 120 in the NMOS region II simultaneously. The contact opening 130 may also expose a portion of the isolation structure 101 and a portion of the fins 110.

In one embodiment, the contact opening 130 may expose tops and sidewalls of the doped epitaxial layers 120. Subsequently, a dielectric layer may be formed to cover each doped epitaxial layer and a metal layer may be formed on the dielectric layers. In comparison with a process where only a portion of the tops of the doped epitaxial layers is exposed, the formed dielectric layer in the present method can cover surfaces of the doped epitaxial layer 120 exposed by the contact opening 130, and the metal layer can surround the doped epitaxial layer 120. A contacting area between the metal layer to be formed and the doped epitaxial layers 120 may be increased, and the contact resistances may be reduced.

In one embodiment, a first portion of the interlayer dielectric layer 102 on the doped epitaxial layers 120 and a second portion of the interlayer dielectric layer 102 on a portion of the isolation structure 101 may be etched by a mask dry etching process, to form the contact opening 130 through the interlayer dielectric layer 102.

The dry etching process may use a gas including $CH_4$ and/or $CHF_3$. An etching amount of the interlayer dielectric layer 102 may determine parameters in the dry etching process.

Figure 3:
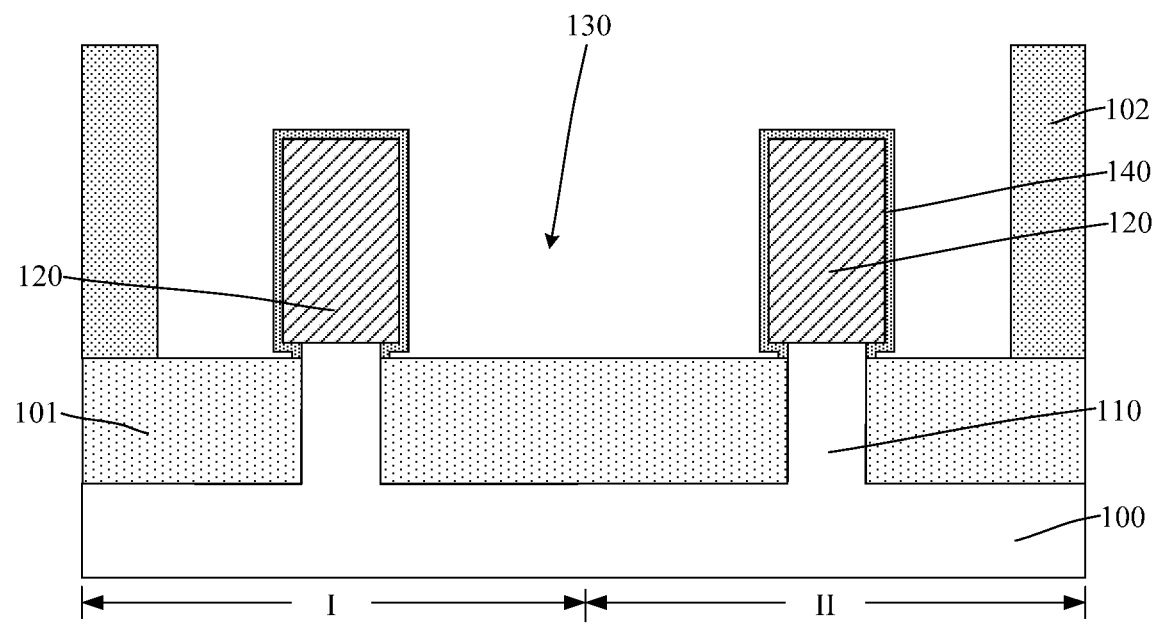

Referring to FIG. 3, after forming the contact opening 130, a dielectric layer 140 may be formed to cover each doped epitaxial layer 120 (e.g., in Step S806 in FIG. 8).

The dielectric layer 140 may be used as a portion of the MIS structure, i.e., the insulating layer in the MIS structure. The positions of the Fermi levels in the interfaces between the conductive plug in the contact opening and the doped epitaxial layers 120 may be changed. The Schottky barrier heights and then the contact resistances may be reduced. The dielectric layer 140 may be also used as a diffusion blocking layer, to block diffusions of materials between the corresponding doped epitaxial layer and the subsequent metal layer. A reaction between the doped epitaxial layer and the subsequent metal layer may be prevented. Further, the dielectric layer 140 may be also used as a tunneling dielectric layer. Electrons may tunnel through the dielectric layer 140, to reduce negative effects on conductions between the conductive plug in the contact opening and the doped epitaxial layer 120.

In various embodiments, the dielectric layer 140 may be made of a material including $SiO_2$, $SiN_x$, $SiN_xO_y$, $GeN_x$, $GeO_2$, $TiO_2$, $CoO_2$, $NiO_2$, $Al_2O_3$, or a combination thereof.

The dielectric layer 140 usually may have a bad conduction, and a thickness of the dielectric layer 140 may not be too large. If the thickness of the dielectric layer 140 is too large, it may be difficult for the electrons to tunnel through the dielectric layer 140, and the contact resistances may be large because of the dielectric layer 140. Correspondingly, the formed semiconductor structure may have a poor performance. In one embodiment, the thickness of the dielectric layer 140 may be smaller than 10 Å.

If the thickness of the dielectric layer 140 is too small, it may be hard to form the dielectric layer 140, and the formed dielectric layer 140 may have a poor uniformity of the thickness and a poor uniformity of the quality.

In one embodiment, the thickness of the dielectric layer 140 may be about 8 Å to about 10 Å, so the thickness of the dielectric layer 140 may be reduced and a realizability of the process may be satisfied simultaneously. Electrons may tunnel through the dielectric layer 140, to reduce negative effects on the conductions between the conductive plug in the contact opening and the doped epitaxial layers 120. The Fermi level pinning effects in the interfaces between the conductive plug in the contact opening and the doped epitaxial layers 120 may be alleviated, to reduce the contact resistances between the conductive plug in the contact opening and the doped epitaxial layers 120. The performance of the formed semiconductor structure may be improved.

The dielectric layer 140 may be formed by a chemical oxidization process, a thermal oxidization process, a chemical vapor deposition process, and/or an atomic layer deposition process.

In one embodiment, the thickness of the dielectric layer 140 may be small. The dielectric layer 140 may be formed by the chemical oxidization process, to precisely control the thickness of the dielectric layer 140. Correspondingly, the dielectric layer 140 may be made of a chemical oxide formed by a chemical dip process.

In one embodiment, the dielectric layer 140 may be made of $SiO_2$, and may be formed by dipping the doped epitaxial layers 120 by an ozone water. The chemical dip process may use a reaction temperature of the room temperature, a reaction time of about 1 minute to about 5 minutes, and an ozone water with a concentration of about 10 ppm to about 80 ppm.

In another embodiment, the dielectric layer 140 may be formed by dipping the doped epitaxial layers 120 with a mixture solution of $H_2SO_4$ and $H_2O_2$. The chemical dip process may use a reaction temperature of about 120° C. to about 180° C., a reaction time of about 1 minute to about 5 minutes, and a volume ration between $H_2SO_4$ and $H_2O_2$ of about 1:1 to about 5:1.

In another embodiment, the dielectric layer 140 may be formed by dipping the doped epitaxial layers 120 with a mixture solution of $NH_4$ and $H_2O_2$. The chemical dip process may use a reaction temperature of about 25° C. to about 45° C., a reaction time of about 1 minute to about 5 minutes, and a volume ration between $NH_4$ and $H_2O_2$ of about 1:4 to about 1:25.

In one embodiment, the dielectric layer 140 formed on the surface of the doped epitaxial layer 120 in the PMOS region I may be made of $GeO_2$, and the dielectric layer 140 formed on the surface of the doped epitaxial layer 120 in the NMOS region II may be made of $SiO_2$.

The chemical oxidization process may only react with the doped epitaxial layer 120, and correspondingly the dielectric layer 140 may be formed on the surfaces of the doped epitaxial layers 120.

The contact opening 130 may also expose a portion of the fins 110. Correspondingly, the dielectric layer 140 may also be formed on exposed surfaces of the corresponding fin 110, and a portion of the dielectric layer 140 on the exposed surfaces of the fin 110 may be made of $SiO_2$.

Figure 4:
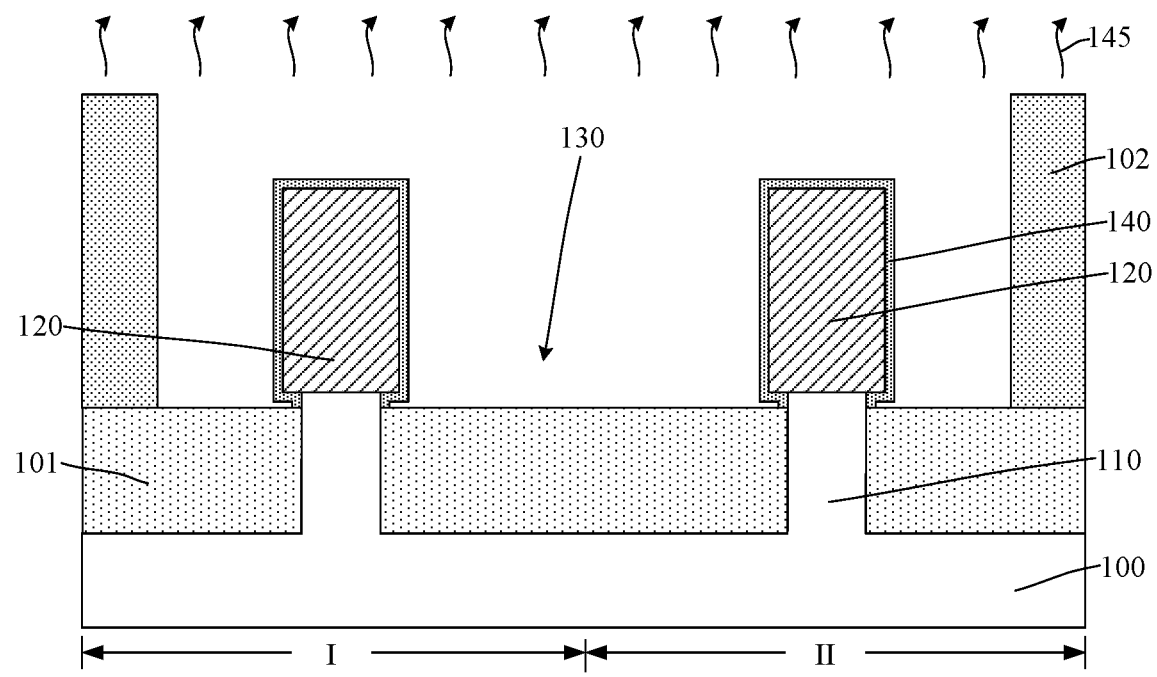

Referring to FIG. 4, the dielectric layer 140 may be repaired by a repairing process 145 (e.g., in Step S808 in FIG. 8).

After forming the dielectric layer 140 on the doped epitaxial layer 120, the dielectric layer 140 may have a poor quality and may have a large number of defects including dangling bonds. Correspondingly, the interfaces between the dielectric layer 140 and the doped epitaxial layer 120 may have a large number of interface defects. The repairing process 145 may reduce the dangling bonds in the dielectric layer 140 and may densify the dielectric layer 140. The interface defects in the interfaces between the dielectric layer 140 and the doped epitaxial layer 120 may be reduced, and the Fermi level pinning effects in the interfaces between the conductive plug in the contact opening and the doped epitaxial layers 120 may be alleviated. The Schottky barrier heights and then the contact resistances may be reduced.

In one embodiment, the repairing process 145 may be an annealing process.

The annealing process may provide enough energy to the dielectric layer 140 so crystalline grains in the dielectric layer 140 may be rearranged. A re-growth of the dielectric layer 140 may be promoted, to reduce the defects in the dielectric layer 140 and to improve a density of the dielectric layer 140.

The annealing process may be a laser annealing process or a spike annealing process. In one embodiment, the annealing process may be the laser annealing process and the laser annealing process may use a pressure of about 1 atm.

A temperature of the laser annealing process cannot be too high or too low, and a time of the laser annealing process cannot be too long or too short.

If a temperature of the laser annealing process is too low, and/or a time of the laser annealing process is too short, the interface defects in the interface between the dielectric layer 140 and the doped epitaxial layer 120 may not be reduced effectively, and the contact resistances may not be reduced enough. If the temperature of the laser annealing process is too high, and/or the time of the laser annealing process is too long, risks in the process may increase. For example, a distribution of the existing doping ions in the substrate and/or a quality of the existing structure may be influenced. In one embodiment, the laser annealing process may use the temperature of about 900° C. to about 1250° C., and the annealing time of about 100 μs to about 3 ms.

In other embodiments, the repairing process 145 may be a UV irradiation process.

The UV irradiation process may provide an energy to passivate the dangling bonds in the dielectric layer 140. The dangling bonds in the dielectric layer 140 then may be reduced, to reduce the interface defects in the interfaces between the dielectric layer 140 and the doped epitaxial layer 120 and to improve the density of the dielectric layer 140.

In one embodiment, the UV irradiation process may use a UV light with a wavelength of about 100 nm to about 300 nm.

The UV light with a smaller wavelength may have a higher energy. The UV light with a wavelength of about 100 nm to about 300 nm may effectively reduce the interface defects in the interfaces between the dielectric layer 140 and the doped epitaxial layer 120. The UV light with a wavelength of about 100 nm to about 300 nm may simultaneously avoid damages on the doped epitaxial layers 120, damages on the gate structures, and damages on the base substrate, induced by the UV light with a higher energy.

Parameters of the UV irradiation process may be configured to effectively reduce the interface defects in the interfaces between the dielectric layer 140 and the doped epitaxial layer 120, but avoid damages on the semiconductor structure including the doped epitaxial layers 120, the gate structures and the base substrate.

In one embodiment, the UV irradiation process may use a UV light with a light intensity of about 100 $mW/cm^2$ to about 2000 $mW/cm^2$, a temperature of about 300° C. to about 500° C., and a time of about 2 minutes to about 10 minutes.

In other embodiments, the repairing process may include the UV irradiation process and the annealing process successive to each other. Then the interface defects in the interfaces between the dielectric layer 140 and the doped epitaxial layer 120 may be reduced further.

Figure 5:
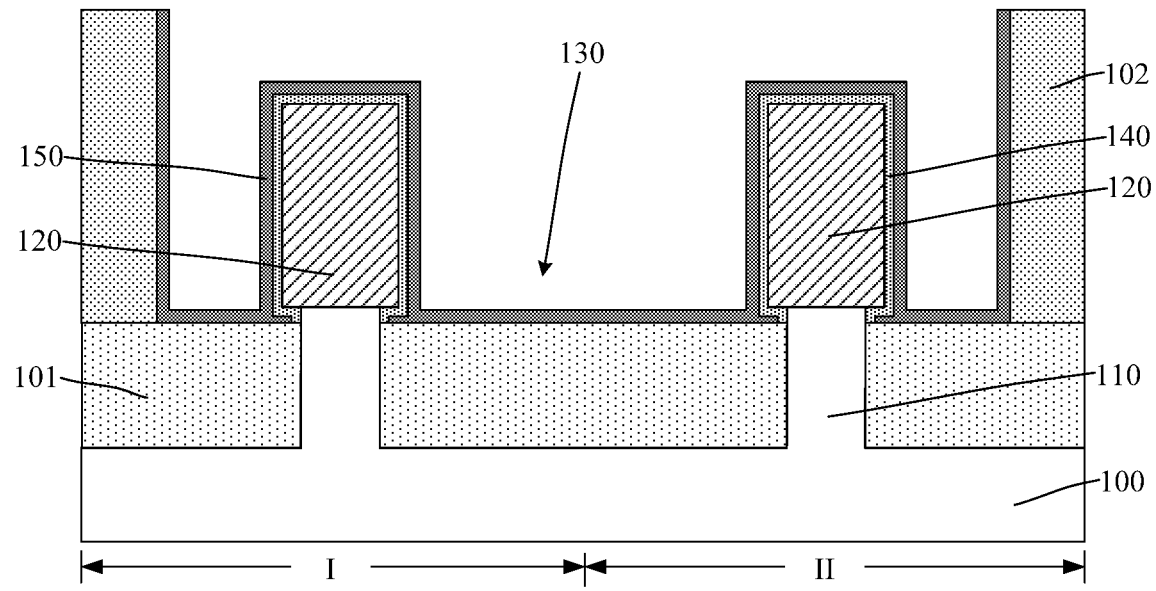

Referring to FIG. 5, after the repairing process 145, a metal layer 150 may be formed on the dielectric layers 140 (e.g., in Step S810 in FIG. 8).

The metal layer 150, a dielectric layer 140 and the corresponding doped epitaxial layer 120 may together form the MIS structure. The positions of the Fermi levels in the interfaces between the conductive plug in the contact opening and the doped epitaxial layers 120 may be changed. The Schottky barrier heights and then the contact resistances may be reduced.

The metal layer 150 may be made of Ti, Pt, Ni, Cr, W, Mo, Co, NiPt, or a combination thereof.

The metal layer 150 with a large thickness may have a higher resistance. If the metal layer 150 has a large thickness, the conduction between the conductive plug in the contact opening and the doped epitaxial layers 120 may be influenced to increase the contact resistances and the formed semiconductor structure may have a poor performance. So the thickness of the metal layer 150 cannot be too large. In one embodiment, the thickness of the metal layer 150 may be smaller than 50 Å.

If the metal layer 150 has a too small thickness, it is more difficult to form the metal layer 150, and the metal layer 150 may have a poor uniformity in the quality and a poor uniformity in the thickness.

In one embodiment, the thickness of the metal layer 150 may be about 10 Å to about 50 Å, to reduce the thickness of the metal layer 150 and to satisfy the realizability of the process. In other embodiments, the thickness of the metal layer 150 may be about 20 Å to about 50 Å.

The metal layer 150 may be formed by an atomic layer deposition process or a physical vapor deposition process.

Referring to FIG. 6, after forming the metal layer 150, a barrier layer 160 may be formed on the metal layer 150 (e.g., in Step S812 in FIG. 8).

When forming the conductive plug in the contact opening 130, the barrier layer 160 may block a reaction between the reactants and the metal layer 150, a reaction between the reactants and the dielectric layer 140, and/or a reaction between the reactants and the doped epitaxial layers 120. The barrier layer 160 may also improve an adhesion of a conductive material of the conductive plug in the contact opening 130.

In one embodiment, the barrier layer 160 may be made of TiN. In other embodiment, the barrier layer 160 may be made of a material including TaN.

The present embodiment may use the MIS structures, and an annealing process on the metal layer 150 may be avoided after forming the barrier layer 160. A thermal budget may be reduced.

Referring to FIG. 7, after forming the metal layer 150 in the contact opening 130, the conductive plug 170 may be formed in the contact opening 130 (e.g., in Step S814 in FIG. 8).

The conductive plug 170 may be electrically connected to the doped epitaxial layers 120, to realize the electrical interconnections in the semiconductor device. The conductive plug 170 may be also used to realize the electrical interconnections between the semiconductor device and external circuits.

In various embodiments, the conductive plug 170 may be made of Al, Cu, Ag, Co, Au, W, or a combination thereof. In one embodiment, the conductive plug 170 may be made of W, and may be formed by a sputtering process or a plating process.

The contact opening 130 may cross the PMOS region I and the NMOS region II. Correspondingly the conductive plug 170 may cross the PMOS region I and the NMOS region II. The conductive plug 170 may also be formed on a portion of the isolation structure 101.

The conductive plug 170 may be formed by filling the contact opening 130 with a conductive material and a portion of the conductive material may also be formed on the top of the interlayer dielectric layer 102. Then the conductive material may be planarized to remove the portion of the conductive material on the top of the interlayer dielectric layer 102 and to form the conductive plug 170 in the contact opening 130.

Various embodiments of the present disclosure also provide a semiconductor structure as shown in FIG. 7. In one embodiment, the semiconductor structure may include: a base substrate 10; gate structures (not shown in the figure) on the base substrate 10; doped epitaxial layers 120 in the base substrate on the sides of a gate structure; a dielectric layer 140 covering each doped epitaxial layer 120; a metal layer 150 on the dielectric layers 140; an interlayer dielectric layer 102 on the base substrate and covering tops of the gate structures; a conductive plug 170 on the metal layer 150 and through the interlayer dielectric layer 102. The dielectric layer 140 may be repaired by a repairing process.

In one embodiment, the semiconductor structure may have a fin structure and may be a FinFET. The base substrate 10 may include a substrate 100, and a plurality of discrete fins 110. In other embodiments, the semiconductor structure may have a planar structure and the base substrate 10 may be a planar substrate.

The substrate 100 may provide a platform for forming the semiconductor structure and the fins 110 may provide channels for the FinFET.

In one embodiment, the substrate 100 may be made of silicon. In other embodiments, the substrate 100 may be made of a material including germanium, SiGe, SiC, GaAs, and/or InGa. The substrate 100 may also be a silicon substrate on an insulator, a germanium substrate on an insulator, or another substrate. The material of the substrate 100 may be appropriate for the process and/or may be easy for integration.

The fins 110 may be made of a material same as the substrate 100, including silicon, germanium, SiGe, SiC, GaAs, and/or InGa, although any suitable materials may be used for the fins according to various embodiments of the present disclosure.

In one embodiment, the semiconductor structure may have a CMOS structure, and the substrate 100 may include a PMOS region I with a PMOS transistor and an NMOS region II with an NMOS transistor. In other embodiments, the semiconductor structure may have a PMOS structure or an NMOS structure. The base substrate may have a PMOS region or an NMOS region accordingly.

In one embodiment, the PMOS region I and the NMOS region II may be adjacent to each other. In other embodiments, the PMOS region I and the NMOS region II may be alternatively formed with one another.

The semiconductor structure may further include an isolation structure 101 on the substrate 100. The isolation structure 100 may cover a portion of sidewalls of the fins 110 and may have a top lower than the tops of the fins 110.

The isolation structure 101 may isolate adjacent semiconductor devices from each other and isolate adjacent fins 110 from each other. In various embodiments, the isolation structure 101 may be made of an insulating material including $SiO_2$, $SiN_x$, and/or $SiN_xO_y$.

The gate structures may control conduction and/or truncation of channels in the semiconductor structure. The doped epitaxial layers 120 may be used as sources and/or drains of the channels in the semiconductor structure.

The gate structures may cross the fins 110, and may cover a portion of tops of the fins 110 and a portion of the sidewalls of the fins 110. In one embodiment, a gate structure may have a metal gate structure. A gate structure may include a gate dielectric layer and a metal gate electrode. In other embodiments, a gate structure may have another gate structure such as a polysilicon gate structure.

In various embodiments, the gate dielectric layer may be made of a high-k dielectric material with a dielectric constant higher than a dielectric constant of $SiO_2$. In one embodiment, the gate dielectric layer may be made of $HfO_2$. In another embodiment, the gate dielectric layer may be made of a material including $ZrO_2$, HfSiO, HfSiON, HfTaO, HfZrO, and/or $Al_2O_3$.

In one embodiment, the gate electrode may be made of W. In another embodiment, the gate electrode may be made of a material including Al, Cu, Ag, Au, Pt, Ni, and/or Ti.

In one embodiment, the doped epitaxial layers 120 may be formed in the fins 110 on the sides of a gate structure. The substrate 100 may include the PMOS region I and the NMOS region II. Correspondingly, the doped epitaxial layers 120 in the fins 110 on the sides of the gate structures in the PMOS region I may be made of a P-type doped material, and the doped epitaxial layers 120 in the fins 110 on the sides of the gate structures in the NMOS region II may be made of a N-type doped material.

The doped epitaxial layers 120 in the PMOS region I may be used to form sources and/or drains of the PMOS device, and the doped epitaxial layers 120 in the NMOS region II may be used to form sources and/or drains of the NMOS device.

In various embodiments, the doped epitaxial layers 120 in the PMOS region I may be made of a material including silicon and/or SiGe doped with P-type ions. The P-type ions may be boron ions, indium ions, gallium ions, or a combination thereof. In one embodiment, the doped epitaxial layers 120 in the PMOS region I may be made of SiGe doped with boron ions, i.e., SiGeB.

That is, the semiconductor structure may include first epitaxial layers. The first epitaxial layers may be made of SiGe, and may be located in the fins 110 on the sides of the gate structures in the PMOS region I. The boron ions may be doped in the first epitaxial layers. The first epitaxial layers may exert stress on the channels in the PMOS device, to enhance mobilities of carriers in the PMOS device.

In various embodiments, the doped epitaxial layers in the NMOS region II may be made of a material including silicon and/or SiC, doped with N-type ions. The N-type ions may be phosphor ions, arsenic ions, antimony ions, or a combination thereof.

In one embodiment, the doped epitaxial layers in the NMOS region II may be made of silicon doped with phosphor ions, i.e., SiP. The doped epitaxial layers 120 made of SiP may reduce the contact resistances in the NMOS region II. That is, the semiconductor structure may include second epitaxial layers. The second epitaxial layers may be made of silicon and may be located in the fins 110 on the sides of the gate structures in the NMOS region II. The second epitaxial layers may be doped with phosphor ions.

The dielectric layer 140 may be used as a portion of the MIS structure, i.e., the insulating layer in the MIS structure. Positions of Fermi levels in interfaces between the conductive plug in the contact opening and the doped epitaxial layers 120 may be changed. Schottky barrier heights and then contact resistances may be reduced. The dielectric layer 140 may also be used as a diffusion blocking layer, to block a diffusion of materials between the doped epitaxial layer 120 and the metal layer 150. A reaction between the doped epitaxial layer 120 and the metal layer 150 may be prevented. Further, the dielectric layer 140 may be used as a tunneling dielectric layer. Electrons may tunnel through the dielectric layer 140, to avoid bad effects on the conduction between the conductive plug in the contact opening and the doped epitaxial layers 120.

In various embodiments, the dielectric layer 140 may be made of a material including $SiO_2$, $SiN_x$, $SiN_xO_y$, $GeN_x$, $GeO_2$, $TiO_2$, $CoO_2$, $NiO_2$, $Al_2O_3$, or a combination thereof.

In one embodiment, the dielectric layer 140 may be made of a chemical oxidization process. Correspondingly, the dielectric layer 140 formed on the surfaces of the doped epitaxial layer 120 in the PMOS region I may be made of $GeO_2$, and the dielectric layer 140 formed on the surfaces of the doped epitaxial layer 120 in the NMOS region II may be made of $SiO_2$.

In one embodiment, the dielectric layer 140 may cover the tops and the sidewalls of the doped epitaxial layer 120. Correspondingly, the metal layer 150 may cover the doped epitaxial layers 120. A contact area between the metal layer 150 and the doped epitaxial layers 120 may be increased, and the contact resistances may be reduced further.

The dielectric layer 140 may be further formed on a portion of surfaces of the corresponding fin 110, and a portion of the dielectric layer 140 on a portion of surfaces of the fin 110 may be made of $SiO_2$.

The dielectric layer 140 usually have a poor conduction. Correspondingly the dielectric layer 140 cannot have a too large thickness. If the thickness of the dielectric layer 140 is too large, it may be difficult for electrons to tunnel through the dielectric layer 140, and the contact resistances may be large because of the dielectric layer 140. Correspondingly, the formed semiconductor structure may have a poor performance. In one embodiment, the thickness of the dielectric layer 140 may be smaller than 10 Å.

If the thickness of the dielectric layer is too small, it may be difficult to form the dielectric layer 140, and the formed dielectric layer 140 may have a poor uniformity in the thickness and in the quality.

In one embodiment, the thickness of the dielectric layer 140 may be about 8 Å to about 10 Å, so the thickness of the dielectric layer 140 may be reduced and a realizability of the process may be satisfied simultaneously. Electrons may tunnel through the dielectric layer 140, to reduce bad effects on the conduction between the conductive plug 170 in the contact opening and the doped epitaxial layer 120. Fermi level pinning effects in interfaces between the conductive plug 170 in the contact opening and the doped epitaxial layers 120 may be alleviated effectively, to reduce the contact resistances between the conductive plug 170 in the contact opening and the doped epitaxial layer 120. The performance of the formed semiconductor structure may be improved.

After forming the dielectric layer 140 on the doped epitaxial layer 120, the dielectric layer 140 may have a poor quality and may have defects including dangling bonds. Correspondingly, the interface between the dielectric layer 140 and the doped epitaxial layer 120 may have a large number of interface defects. A repairing process may be applied on the dielectric layer 140 after forming the dielectric layer 140, to reduce the dangling bonds in the dielectric layer 140 and to densify the dielectric layer 140. The interface defects in the interface between the dielectric layer 140 and the doped epitaxial layer 120 may be reduced, and the Fermi level pinning effects in the interfaces between the conductive plug in the contact opening and the doped epitaxial layers 120 may be alleviated. The Schottky barrier heights and then the contact resistances may be reduced.

In one embodiment, the repairing process 145 may be an annealing process, a UV irradiation process, or a combination thereof.

The metal layer 150, the dielectric layer 140 and the doped epitaxial layer 120 may together form the MIS structure. The positions of the Fermi levels in the interfaces between the conductive plug 170 in the contact opening and the doped epitaxial layer 120 may be changed. The Schottky barrier heights and then the contact resistances may be reduced.

The metal layer 150 may be made of Ti, Pt, Ni, Cr, W, Mo, Co, NiPt, or a combination thereof.

The metal layer 150 with a large thickness may have a higher resistance. If the metal layer 150 has a too large thickness, the conduction between the conductive plug 170 in the contact opening and the doped epitaxial layers 120 may be influenced. The contact resistances may increase and the formed semiconductor structure may have a poor performance. So the thickness of the metal layer 150 cannot be too large. In one embodiment, the thickness of the metal layer 150 may be smaller than 50 Å.

If the metal layer 150 has a too small thickness, it is more difficult to form the metal layer 150, and the metal layer 150 may have a poor uniformity in the quality and in the thickness.

In one embodiment, the thickness of the metal layer 150 may be about 10 Å to about 50 Å, to reduce the thickness of the metal layer 150 and to satisfy the realizability of the process simultaneously. In other embodiments, the thickness of the metal layer 150 may be about 20 Å to about 50 Å.

The metal layer 150 may be formed by an atomic layer deposition process or a physical vapor deposition process.

The metal layer 150 may be located between the conductive plug 170 and the dielectric layer 140, between the conductive plug 170 and the isolation structure 101, and between the conductive plug 170 and the interlayer dielectric layer 102.

The interlayer dielectric layer 102 may be used to electrically isolate the adjacent semiconductor structures from each other.

In various embodiments, the interlayer dielectric layer 102 may be made of an insulating material. In one embodiment, the interlayer dielectric layer 102 may be made of $SiO_2$. In another embodiment, the interlayer dielectric layer 102 may be made of $SiN_x$, and/or $SiN_xO_y$.

The conductive plug 170 in the contact opening may be electrically connected to the doped epitaxial layers 120, to realize the electrical interconnections in the semiconductor device. The conductive plug 170 may be also used to realize the electrical interconnections between the semiconductor device and external circuits.

In various embodiments, the conductive plug 170 may be made of Al, Cu, Ag, Co, Au, W, or a combination thereof. In one embodiment, the conductive plug 170 may be made of W, and may be formed by a sputtering process or a plating process.

To increase a process window and reduce a difficulty in a process for forming the conductive plug 170 in the contact opening, the conductive plug 170 in the contact opening may cross the PMOS region I and the NMOS region II, and also may be located on a portion of the isolation structure 101.

The semiconductor structure may further include a barrier layer 160 between the conductive plug 170 and the metal layer 150.

When forming the conductive plug 170 in the contact opening 130, the barrier layer 160 may block a reaction between reactants and the metal layer 150, a reaction between the reactants and the dielectric layer 140, and/or a reaction between the reactants and the doped epitaxial layers 120. The barrier layer 160 may also improve an adhesion of a conductive material of the conductive plug in the contact opening 130.

In one embodiment, the barrier layer 160 may be made of TiN. In another embodiment, the barrier layer 160 may be made of TaN.

The semiconductor structure may be formed by the methods provided by various embodiments of the present disclosure. Other aspects of the semiconductor structure can refer to the previous description of the fabrication methods provided by various embodiments of the present disclosure.

In the present disclosure, a repairing process may be applied to the dielectric layer after forming the dielectric layer. The repairing process may reduce the dangling bonds in the dielectric layer and may densify the dielectric layer. The interface defects in the interface between the dielectric layer and the doped epitaxial layer may be reduced, and the Fermi level pinning effects in the interfaces between the conductive plug in the contact opening and the doped epitaxial layers may be alleviated. The Schottky barrier heights and the contact resistances may be reduced. The performance of the semiconductor structure may be improved.

In the present disclosure, the contact opening may expose the tops and the sidewalls of the doped epitaxial layers. Subsequently, the dielectric layer may be formed to cover the doped epitaxial layer and the metal layer may be formed to surround the doped epitaxial layers. The contacting areas between the metal layer and the doped epitaxial layers may be increased, and the contact resistances may be reduced further.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor structure, comprising:
   a base substrate, wherein the base substrate includes a substrate and a plurality of discrete fins on the substrate;
   a first doped epitaxial layer and a second doped epitaxial layer on the plurality of discrete fins, the first doped epitaxial layer and the second doped epitaxial layers corresponding to different gate structures on the base substrate;
   an interlayer dielectric layer over the base substrate and covering tops of the different gate structures, wherein the interlayer dielectric layer has a contact opening exposing surfaces of the first and second doped epitaxial layers;
   a repaired dielectric layer formed on the exposed surfaces of the first doped epitaxial layer and the second doped epitaxial layer;
   a metal layer formed on the repaired dielectric layer; and
   a conductive plug on the metal layer and filling the contact opening in the interlayer dielectric layer.

2. The semiconductor structure according to claim 1, wherein: the repaired dielectric layer is made of one of $SiO_2$, $SiN_x$, $SiNxO_y$, $GeN_x$, $GeO_2$, $TiO_2$, $CoO_2$, $NiO_2$, $Al_2O_3$, or a combination thereof.

3. The semiconductor structure according to claim 1, wherein: the repaired dielectric layer has a thickness of about 8 Å to about 10 Å.

4. The semiconductor structure according to claim 1, wherein:
   the repairing process is an annealing process, a UV irradiation process, or a combination thereof.

5. The semiconductor structure according to claim 1, wherein: the metal layer is made of one of Ti, Pt, Ni, Cr, W, Mo, Co, NiPt, or a combination thereof.

6. The semiconductor structure according to claim 1, wherein: the metal layer has a thickness of about 10 Å to about 50 Å.

7. The semiconductor structure according to claim 1, wherein:
   the first doped epitaxial layer is formed on a first fin and on a side of a first gate structure formed on the first fin, and
   the second doped epitaxial layer is formed on a second fin and on a side of a second gate structure formed on the second fin.

8. The semiconductor structure according to claim 1, wherein:
   the first doped epitaxial layer has a first width greater than a width of each of the plurality of discrete fins in a direction perpendicular to sidewall surfaces of the plurality of discrete fins, and
   the second doped epitaxial layer has a second width greater than the width of each of the plurality of discrete fins in the direction perpendicular to the sidewall surfaces of the plurality of discrete fins.

9. The semiconductor structure according to claim 1, further including:

an isolation structure formed on the substrate between the plurality of discrete fins.

10. The semiconductor structure according to claim 9, wherein: the repaired dielectric layer is further conformally formed on sidewall surfaces of the plurality of discrete fins, wherein gaps are formed between the repaired dielectric layer and the isolation structure.

11. The semiconductor structure according to claim 10, wherein: the metal layer fills up the gaps between the repaired dielectric layer and the isolation structure.

* * * * *